US010744615B2

(12) United States Patent
Sato et al.

(10) Patent No.: US 10,744,615 B2
(45) Date of Patent: Aug. 18, 2020

(54) METHOD FOR POLISHING WAFER AND POLISHING APPARATUS

(71) Applicant: SHIN-ETSU HANDOTAI CO., LTD., Tokyo (JP)

(72) Inventors: Kazuya Sato, Nasushiobara (JP); Hiromasa Hashimoto, Nishigo-mura (JP); Naoki Kamihama, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 345 days.

(21) Appl. No.: 15/768,970

(22) PCT Filed: Oct. 17, 2016

(86) PCT No.: PCT/JP2016/004596
§ 371 (c)(1),
(2) Date: Apr. 17, 2018

(87) PCT Pub. No.: WO2017/077691
PCT Pub. Date: May 11, 2017

(65) Prior Publication Data
US 2018/0290261 A1    Oct. 11, 2018

(30) Foreign Application Priority Data
Nov. 6, 2015  (JP) .................... 2015-218440

(51) Int. Cl.
*B24B 37/013* (2012.01)
*B24B 37/04* (2012.01)
(Continued)

(52) U.S. Cl.
CPC .......... *B24B 37/013* (2013.01); *B24B 37/042* (2013.01); *B24B 37/20* (2013.01);
(Continued)

(58) Field of Classification Search
CPC ..... B24B 37/013; B24B 37/042; B24B 37/20; B24B 37/34; H01L 21/304; H01L 21/30625; H01L 22/26
See application file for complete search history.

(56) References Cited

U.S. PATENT DOCUMENTS 9,278,425 B2 * 3/2016 Hashimoto ............. B24B 37/30
10,062,574 B2 * 8/2018 Ahn ........................ B24B 37/04
(Continued)

FOREIGN PATENT DOCUMENTS

JP    2004-023038 A    1/2004
JP    2004-239718 A    8/2004
(Continued)

OTHER PUBLICATIONS

Dec. 27, 2016 International Search Report issued in Patent Application No. PCT/JP2016/004596.

*Primary Examiner* — Dung Van Nguyen
(74) *Attorney, Agent, or Firm* — Oliff PLC

(57) ABSTRACT

The present invention provides a method for polishing a wafer including, after unloading and before loading to hold a next wafer to be polished: measurement to measure a depth $PD_t$ of a concave portion of a template after taking out a polished wafer; calculation to calculate a difference $\Delta PD$ between the measured depth $PD_t$ of the concave portion and a depth $PD_0$ of the concave portion of the template before being used for polishing; and adjustment to adjust polishing conditions for a next wafer to be polished in accordance with the calculated difference $\Delta PD$. Consequently, there are provided the method for polishing a wafer and a polishing apparatus which enable adjusting a fluctuation in flatness of each wafer caused due to a fluctuation in numerical value of a pocket depth of a template.

16 Claims, 7 Drawing Sheets

(51) Int. Cl.
- *B24B 37/20* (2012.01)
- *B24B 49/12* (2006.01)
- *H01L 21/66* (2006.01)
- *H01L 21/306* (2006.01)
- *B24B 37/34* (2012.01)
- *H01L 21/304* (2006.01)

(52) U.S. Cl.
CPC .............. *B24B 37/34* (2013.01); *B24B 49/12* (2013.01); *H01L 21/304* (2013.01); *H01L 21/30625* (2013.01); *H01L 22/26* (2013.01)

(56) References Cited

U.S. PATENT DOCUMENTS

2013/0324012 A1  12/2013  Fukushima et al.
2016/0008947 A1  1/2016  Sato

FOREIGN PATENT DOCUMENTS

| | | |
|---|---|---|
| JP | 4013187 B2 | 11/2007 |
| JP | 2012-076157 A | 4/2012 |
| JP | 2014-004675 A | 1/2014 |
| JP | 2014-184511 A | 10/2014 |

* cited by examiner

METHOD FOR POLISHING WAFER AND POLISHING APPARATUS

TECHNICAL FIELD

The present invention relates to a method for polishing a wafer and a polishing apparatus.

BACKGROUND ART

Polishing of wafers is often performed by a waxless mount polishing apparatus which contains a wafer in an annular member made of, e.g., glass epoxy and holds a back side of the wafer by a backing pad placed between the wafer and a polishing head. Usually, to perform this polishing, a template having the annular member bonded to the backing pad is used. The template is usually attached to an annular base ring made of PVC (polyvinyl chloride), titanium, or the like in the polishing head, and used in this state.

CITATION LIST

Patent Literatures

Patent Literature 1: Japanese Unexamined Patent Application Publication No. 2004-23038
Patent Literature 2: Japanese Patent No. 4013187

DISCLOSURE OF INVENTION

Problem to be Solved by the Invention

In such waxless mount type polishing as described above, there is a phenomenon that a shape of a polished wafer changes in correspondence with a use time of the template, and this is a problem in stabilization, of flatness of the wafer.

In conventional examples, flatness of a polished wafer is measured with respect such a change in shape of the wafer and, when the measured flatness is below standards this problem is sequentially tackled by e.g., replacing the template with a new one or with a used template adopted in another apparatus so that the flatness of the polished wafer can fail within the standards. However, in case of dealing with a result of the measurement of the flatness of the wafer; a time lag occurs in adjustment of the flatness due to the replacement of the template, thus leading to the wafer whose flatness is below standards. Further, if the flatness fails within standards, any adjustment is not performed in particular, and hence a variation in flatness of the wafer from an initial stage to a terminal stage of a life of the template becomes large.

As a result of studies, the present inventors have found out that an aging variation of a pocket depth (which will be also referred to as PD hereinafter which is a depth of a concave portion in which a wafer is housed and held by an inner peripheral surface of an annular member and a surface of backing pad which is attached to the annular member concerns a flatness fluctuation corresponding to a use trine of the template. Furthermore, they have acknowledged that a main cause of the aging variation of the PD is abrasion of the annular member and deformation of the backing pad. However, in a conventional technology, the aging variation of the PD is not taken into consideration, and the PD is measured before and after attachment of the polishing head alone.

For example, Patent Literature 1 discloses that a protrusion is provided on a surface of a retainer ring (an annular member) of a template and a polishing pad is in-situ-dressed during polishing, and flatness of a wafer is thereby stabilized. However, in this patent literature, the flatness fluctuation due to abrasion of the annular member and deformation of the backing pad is not taken into consideration. Further, it has a description that ceramics having abrasion resistance can be used as a material of the annular member, but there arises a problem, e.g., occurrence of an obstruction such that cracks are produced in a work edge portion at an inner peripheral end when this material is used.

Further, Patent Literature 2 discloses that adjustment is performed by inserting or removing a spacer having a thickness of approximately 10 μm between a main body of a polishing head and a template in correspondence with a target wafer thickness. However, it has no description on whether fine adjustment which enables flatness control can be performed. Further, even if such adjustment can be performed, an operation is troublesome, there is no description about means for confirming a level difference, after inserting/removing the spacer, and a flatness fluctuation due to aging variation of PD is not taken into consideration.

In view of such a problem as described above, it is an object of the present invention to provide a method for polishing a wafer and a polishing apparatus which enable adjusting a fluctuation in flatness of a wafer due to a fluctuation in numerical value of a pocket depth of a template.

Means for Solving Problem

To achieve the object, the present invention provides a method for polishing a wafer by which a plurality of wafers are polished, with the use of a rotatable polishing head having a template which has an annular member and a backing pad attached to each other and has a concave portion to house and hold a wafer formed therein by using an inner peripheral surface of the annular member and a surface of the backing pad attached to the annular member, by repeating loading to house and hold the wafer in the concave portion, polishing to press the wafer held by the polishing head against a polishing pad attached to an upper side of a rotatable turntable for polishing while rotating the turntable and the polishing head, and unloading to take out the polished wafer from the concave portion of the template, the method being characterized by including, after the unloading and before the loading to hold a next wafer to be polished: measurement to measure a depth $PD_t$ of the concave portion after taking out the polished wafer; calculation to calculate a difference $\Delta PD$ between the measured depth $PD_t$ of the concave portion and a depth $PD_0$ of the concave portion of the template before being used for polishing; and adjustment to adjust polishing conditions for a next wafer to be polished in accordance with the calculated difference $\Delta PD$.

With this arrangement, it is possible to appropriately adjust the polishing conditions under which a fluctuation in numerical value of the pocket depth of the template is measured and a fluctuation in flatness of the wafer is adjusted (suppressed in particular) in correspondence with this numerical value. Consequently, a variation in flatness of the wafer corresponding to a use time of the template can be reduced.

At this time, in the adjustment, an abrasion loss of the annular member during polishing can be adjusted in such a manner that the difference $\Delta PD$ decreases by adjusting one or both of a relative speed of the number of revolutions of the turntable and the number of revolutions of the polishing head and a polishing pressure.

In this mariner, when the polishing conditions are adjusted in such a manner that the difference ΔPD between $PD_t$ and $PD_0$ becomes small, i.e., that the depth of the concave portion of the template does not fluctuation from an initial stage, a variation in flatness of the wafer corresponding to a use time of the template can be reduced.

Further, at this time, in the adjustment, a plastic deformation, amount of the backing pad can be adjusted in such a manner that ΔPD decreases by changing the backing; pad to another backing pad having a different amount of plastic deformation caused by the polishing pressure.

In this manner, when the polishing conditions are adjusted in such a manner that, the depth of the concave portion of the template does not fluctuate from the initial stage, a variation in flatness of the wafer corresponding to a use time of the template cam be reduced.

Furthermore, the adjustment can be performed when the difference ΔPD between the depth $PD_t$ and the depth $PD_0$ has exceeded a predetermined value.

When it has been determined that the difference ΔPD in depth is larger than the predetermined value and flatness of a next wafer to be polished can become larger than a preset threshold value, performing the adjustment enables adjusting the polishing conditions while suppressing a reduction in productivity and enables reducing a variation in flatness.

Moreover, to achieve the object, the present invention provides a polishing apparatus including: a rotatable polishing head having a template which has an annular member and a backing pad attached to each other and has a concave portion to house and hold a wafer formed therein by using an inner peripheral surface of the annular member and a surface of the backing pad attached to the annular member; and a polishing pad attached to an upper side of a rotatable turntable, the apparatus pressing the wafer held by the polishing head against the polishing pad for polishing while rotating the turntable and the polishing head, the polishing apparatus being characterized by including: measuring means configured to measure a depth $PD_t$ of the concave portion of the template after taking out the polished wafer; calculating means for calculating a difference ΔPD between the measured depth $PD_t$ of the concave portion and a depth $PD_0$ of the concave portion of the template before being used for polishing; and adjusting means for adjusting polishing conditions for a next wafer to be polished in accordance with the calculated difference ΔPD.

According to such a polishing apparatus, it is possible to appropriately adjust the polishing conditions to polishing conditions under which a fluctuation in numerical value of the pocket depth of the template is measured and a fluctuation in flatness of the wafer can be especially suppressed in correspondence with the numerical value. Consequently, there is provided the polishing apparatus which can reduce a variation in flatness of the wafer in correspondence with a use time of the template.

At this time, it is preferable for the adjusting means to adjust an abrasion loss of the annular member during polishing in such a manner that the difference ΔPD decreases by adjusting one or both of a relative speed of the number of revolutions of the turntable and the number of revolutions of the polishing head and a polishing pressure.

According to such a polishing apparatus, it is possible to reduce a variation in flatness of the wafer corresponding to a use time of the template by adjusting the polishing conditions in such a manner that the depth of the concave portion of the template does not fluctuate from the initial stage.

Additionally, at this time, it is preferable for the adjusting means to adjust the polishing conditions when the difference ΔPD between the depth $PD_t$ and the depth $PD_0$ has exceeded a predetermined value.

When it has been determined that the difference ΔPD in depth is larger than the predetermined value and flatness of a next wafer to be polished can become larger than a preset, threshold value, performing the adjustment enables adjusting the polishing conditions while suppressing a reduction in productivity and enables reducing a variation in flatness.

Further, it is preferable for the measuring means to include: a sensor unit which measures the depth $PD_t$ of the concave portion of the template from which the polished wafer has been removed; and a movement unit which moves the sensor unit to be placed below the template at the time of measuring the depth $PD_t$ of the concave portion.

The polishing apparatus according to the present invention, the depth $PD_t$ of the concave portion can be measured by such measuring means.

Effect of the Invention

According to the method for polishing a wafer and the polishing apparatus of the present invention, a fluctuation in flatness of a wafer can be suppressed by monitoring a fluctuation in numerical value of the depth of the concave portion of the template and adjusting polishing conditions in correspondence with this numerical value.

BEST MODE(S) FOR CARRYING OUT THE INVENTION

An embodiment of the present invention will now be described hereinafter, but the present invention is not restricted thereto.

As described above, there is a problem that flatness of a wafer fluctuates in correspondence with a use time of a template, and a variation in flatness of the wafer increases.

Thus, the present inventors have repeatedly conducted the earnest examination to solve such a problem. Consequently, they have found out that the fluctuation in flatness is mainly caused due to a fluctuation in depth (PD) of a concave portion of the template. Further, they have conceived that the variation in flatness can be adjusted and, for example, suppressed by adjusting polishing conditions while monitoring a value of PD, thereby bringing the present invention to completion.

Figure 1:
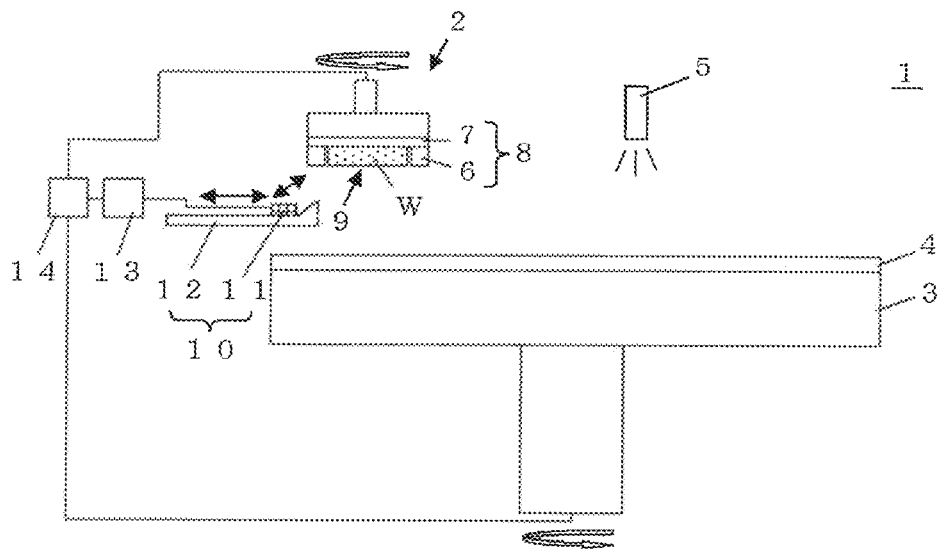
FIG. 1 is a schematic view showing an example of a polishing apparatus according to the present invention.

A polishing apparatus according to the present invention will be first described hereinafter in detail with reference to FIGS. 1 to 3, but the present invention is not restricted thereto. As shown in FIG. 1, the polishing apparatus 1 according to the present invention includes a rotatable polishing head 2 configured to hold a wafer W, a rotatable turntable 3, and a polishing pad 4 attached to an upper side of the turntable 3. Furthermore, it may also include a polishing agent supply mechanism 5 which supplies a polishing agent to the polishing pad 4 at the time of polishing the wafer W.

The polishing head 2 has a template 8 formed by attaching an annular member 6 to a backing pad 7. As shown in FIG. 1, in the template 8, an inner peripheral surface of the annular member 6 and a surface of the backing pad 7 attached to the annular member 6 form a concave portion 9 in which the wafer W is housed and held.

In this polishing apparatus 1, a back surface of the wafer W is held by the backing pad 1, an edge portion of the wafer W is held by the annular member 6, the polishing agent is supplied onto the polishing pad 4 from the polishing agent supply mechanism 5, and the wafer W is pressed to the polishing pad 4 while rotating the turntable 3 and the polishing head 2 respectively, thereby polishing the wafer W while being rubbed against the polishing pad 4.

Furthermore, the polishing apparatus 1 according to the present invention includes measuring means 10 which can measure a depth $PD_t$ of the concave portion 9 of the template 8 after taking out the polished wafer W. The measuring means 10 has, e.g., a sensor unit 11 and a movement unit 12 which moves the sensor unit 11 to be placed below the template 8 at the time of measuring the concave portion depth $PD_t$.

Figure 2:
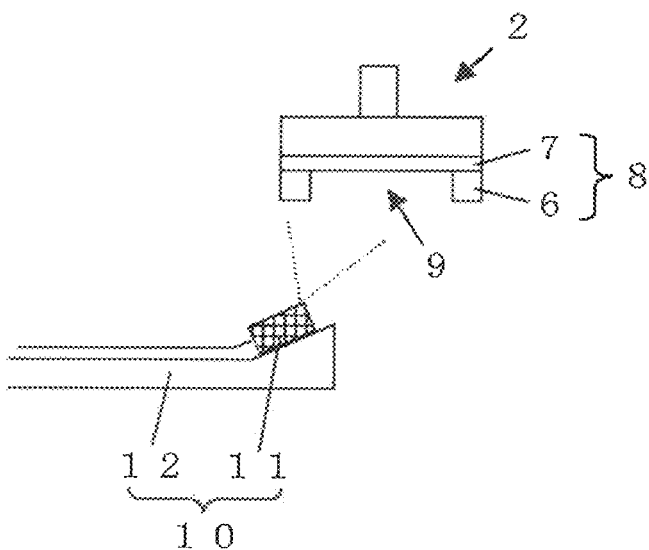
FIG. 2 is a schematic view snowing an example of a mode at the time of measuring a depth $PD_t$ of a concave portion by measuring means of the polishing apparatus according to the present invention.

As shown in FIG. 2, the sensor unit 11 can measure the depth $PD_t$ of the concave portion 9 of the template 8 from which the polished wafer W has been taken out, and the movement unit 12 can move the sensor unit 11 to be placed below the template 8 at the time of measuring the concave portion depth $PD_t$.

As the sensor unit 11, an in-line type laser displacement gauge can be used. As such, a displacement gauge, for example, LJ-V7020 (manufactured by KEYENCE Corporation) can be used. As to the measurement of $PD_t$ based on this system, a level difference of the annular member 6 and the backing pad 7 is line-scanned, a level difference between a reflected optical image from a surface of the annular member 6 and a reflected optical image from a surface of the backing pad 7 can be measured as $PD_t$. Additionally, a cover may be provided to the sensor unit 11 to prevent droplets of the polishing agent from striking on the sensor unit 11.

Further, as the movement unit 12, an X axis direction slider which enables movement in an X axis direction (a horizontal direction) can be used. A standby position of the sensor unit 11 during polishing the wafer W is a position which does not obstruct the polishing, and the sensor unit 11 is moved to be placed below the template 8 at the time of measuring the concave portion depth $PD_t$ after unloading the wafer W. The position below the template 8 is, e.g., a position at which the level difference of the annular member 6 and the backing pad 7 is included in a measurement range of the sensor unit 11.

For example, the measuring means 10 may have a laser displacement gauge disposed at a tip of the X axis direction slider, and may be set so that the laser displacement gauge can advance to a position below the template 8 and the laser displacement gauge can retreat from the position below the template 8.

Furthermore, the polishing apparatus 1 includes calculating means 13 which calculates $\Delta PD$ which is a difference between the depth $PD_t$ of the concave portion 9 measured by the measuring means 10 and a depth $PD_0$ of the concave portion 9 of the template 8 before being used for polishing. As the calculating means 13, a personal computer (PC) or the like can be used. Moreover, it also includes adjusting means 14 which adjusts polishing conditions for the next wafer W to be polished in accordance with the difference $\Delta PD$ calculated by the calculating means 13.

According to such a polishing apparatus 1 of the present invention, the depth $PD_t$ of the concave portion 9 of the template 8 is measured, and the polishing conditions can be appropriately adjusted to polishing conditions which enable particularly suppressing a fluctuation in flatness of the wafer W in correspondence with the difference $\Delta PD$ between $PD_t$ and $PD_0$. Additionally, since the adjustment can be performed based on a value of $PD_t$ before obtaining a flatness measurement result after the polishing, a course of changes in flatness can be corrected with a smaller time lag, and hence a variation in flatness of the wafer from an initial stage to a terminal stage of a life of the template can be suppressed.

Further, to reduce a variation in flatness of the wafer W, more specifically, it is preferable for the adjusting means 14 to adjust an abrasion loss of the annular member 6 at the time of the polishing so that the difference $\Delta PD$ can decrease by adjusting one or both of a relative speed of the number of revolutions of the turntable 3 and the number of revolutions of the polishing head 2 and a polishing pressure. When an amount of change of the depth $PD_t$ of the concave portion 9 from the concave portion depth $PD_0$ on the initial stage is reduced, a variation in flatness of the wafer W can be decreased. The reason will be described hereinafter.

Figure 3:
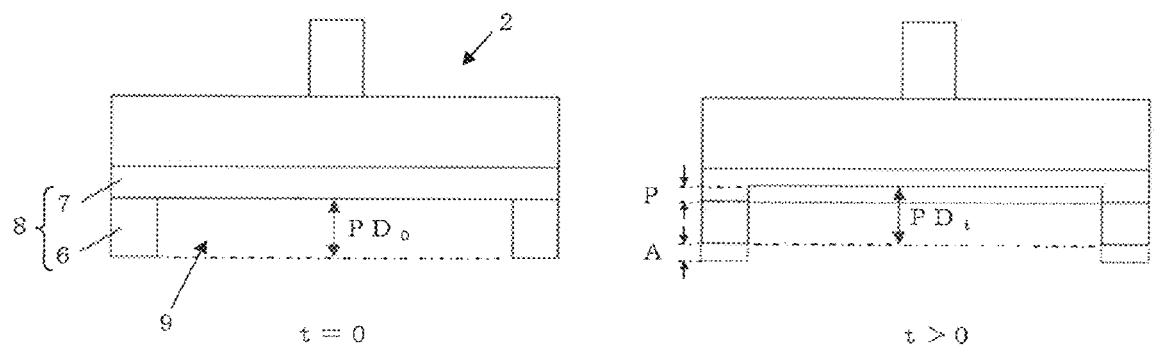
FIG. 3 is a view describing a change in depth of the concave portion of the template associated with use for polishing.

As shown in FIG. 3, before the template 8 is used for polishing, i.e., when a use time t of the template 8 for polishing is 0, the depth $PD_0$ of the concave portion 9 is equal to a thickness of the annular member 6 on the initial stage. However, as shown in FIG. 3, two elements, i.e., an abrasion loss A of the annular member 6 and a plastic deformation amount P of the backing pad 7 are added to the depth $PD_t$ of the concave portion 9 when t>0. That is, the depth $PD_t$ of the concave portion 9 when t>0 is expressed as $PD_t = PD_0 - A + P$.

According to this expression, it can be understood that $PD_t$ is shallower than $PD_0$ when A>P, $PD_t$ is deeper than $PD_0$ when A<P, and $PD_t$ is equal to $PD_0$ when A=P. Thus, the expression means that sag of the wafer advances when A>P, rise of the same advances when A<P, and a fluctuation in flatness of the wafer corresponding to the use time of the template 8 hardly occurs when A~P, respectively.

As described above, the expression means that, when $-A+P \to 0$, $PD_t \to PD_0$ is achieved, and $PD_t$ can be maintained at a value closer to $PD_0$ even after the life of the template 8 has proceeded. That is, when a magnitude relation between A and P is controlled and the difference $\Delta PD$ between $PD_t$ and $PD_0$ is reduced, a variation in flatness of the wafer can be decreased.

Here, since A is an abrasion loss (or an abrasion rate) of the annular member 6, it can be adjusted by using a relative speed of the numbers of revolutions of the polishing head 2 and the turntable 3 or a polishing pressure. On the other hand, since P is a plastic deformation amount of the backing pad 7, it can be adjusted by using the polishing pressure, a compression ratio of the backing pad 7, or the like. With such adjustments, when $-A+P \to 0$ can be achieved, namely, when $PD_t$ can be controlled to a value which is close to $PD_0$ as much as possible, a fluctuation in flatness of the wafer based on the use time t of the template can be reduced. Furthermore, since the rotational speeds of the turntable 3 and the polishing head 2 or the polishing pressure can be changed by varying a polishing recipe, the rotational speed or the polishing pressure can be adjusted without replacing the template 8, and hence a reduction in productivity can be suppressed.

Moreover, in the polishing apparatus 1 according to the present invention, when the difference $\Delta PD$ between the depth $PD_t$ and the depth $PD_0$ exceeds a predetermined value, the adjusting means 14 can adjust the polishing conditions. With such arrangement, a fluctuation in flatness of the wafer can be reduced while avoiding a reduction in productivity.

The method for polishing a wafer according to the present invention will now be described with reference to an example using the polishing apparatus 1 of the present invention.

Figure 4:
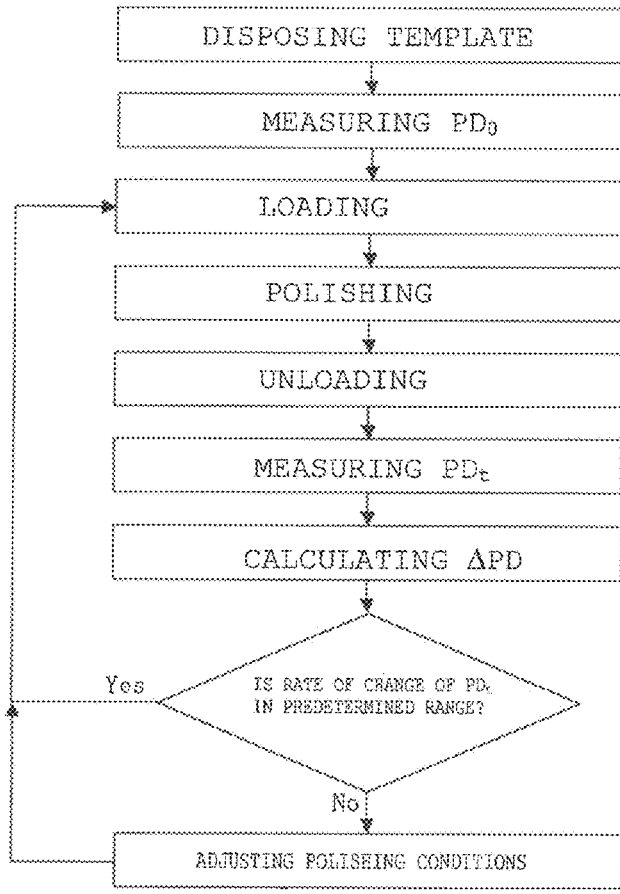
FIG. 4 is a flowchart showing an example of a method for polishing a wafer according to the present invention.

FIG. 4 shows a flowchart of an example of the method for polishing a wafer according to the present invention. First, disposing the template 8 to the polishing head 2 is performed. Then, measurement of the depth $PD_0$ of the concave portion 9 of the template 8 before being used for polishing is carried out. Subsequently, loading to house and hold the wafer W in the concave portion 9, polishing to press the wafer W held by the polishing head 2 against the polishing pad 4 attached to the upper side of the rotatable turntable 3 and to polish the wafer W while rotating the turntable 3 and the polishing head. 2, and unloading to take out the polished wafer W from the concave portion 9 of the template are performed.

Figure 5:
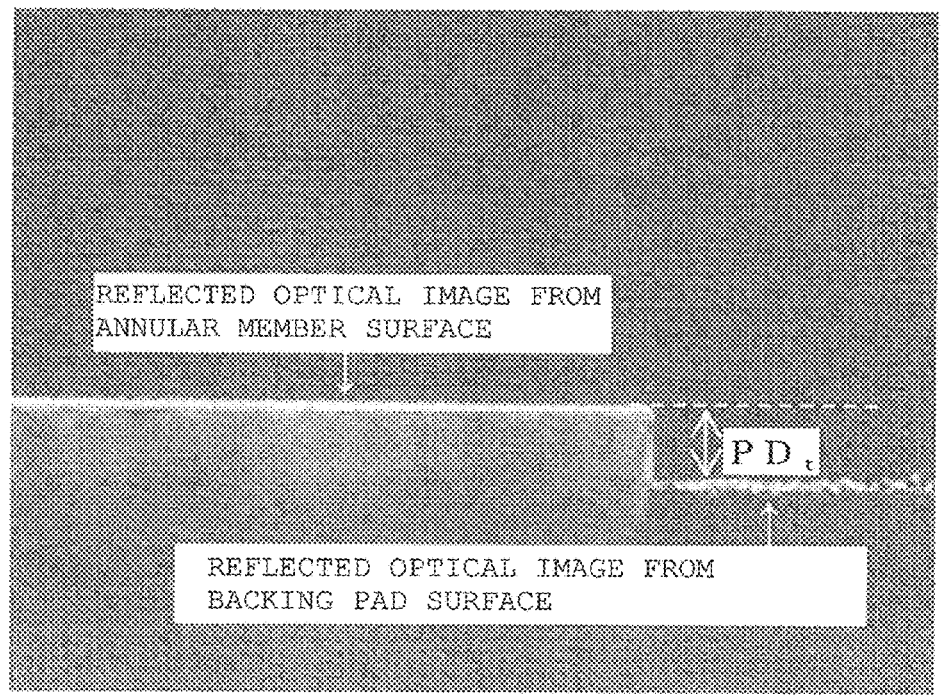
FIG. 5 is a view showing an example of an imaging result provided by an in-line type laser displacement gauge.

Then, the measuring means 10 is used to perform measurement to measure the depth $PD_t$ of the concave portion 9. At this time, it is preferable to perform the measurement, at the timing when the polishing head 2 is placed at an elevated position after the polishing is finished and the wafer W is unloaded from the polishing head 2. Further, an in-line type laser displacement gauge can be used for the measurement to measure the depth $PD_t$ of the concave portion 9, FIG. 5 shows an example of an imaging result of one line. In this manner, the depth $PD_t$ of the concave portion 9 can be measured from a level difference between reflected optical images from surfaces of the annular member 6 and the backing pad 7.

Figure 6:
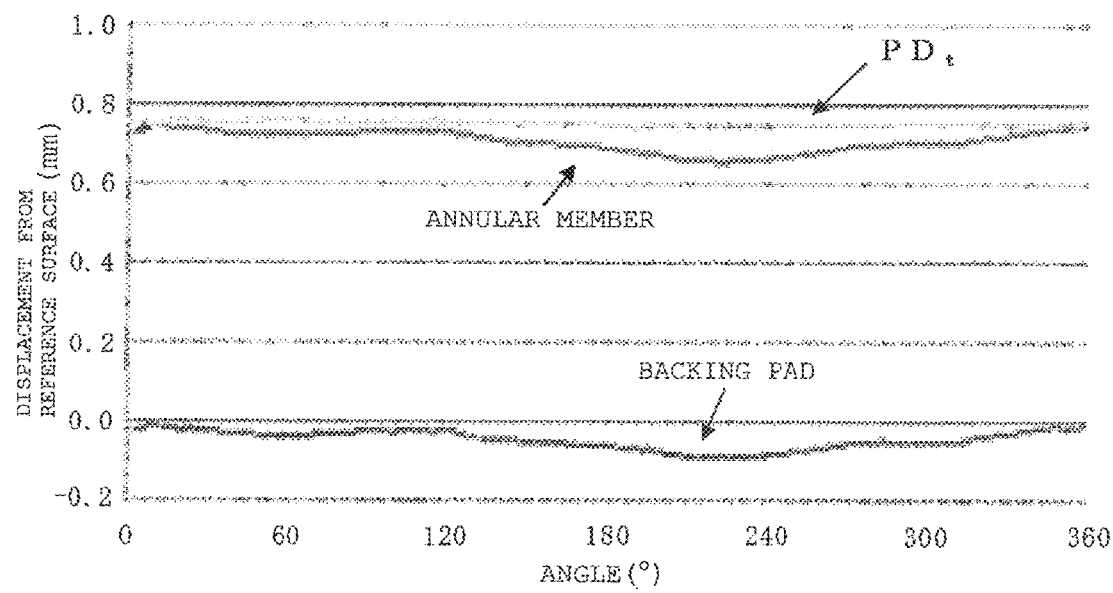
FIG. 6 is a graph showing an example of a measurement result provided by the in-line type laser displacement gauge.

Furthermore, after the sensor unit 11 is advanced to a position where $PD_t$ can be measured, the sensor can be linked with rotation of the polishing head to acquire a line profile in accordance with each angle by using a servo motor which drives the polishing head 2 to rotate and an external synchronization signal, and a distribution of $PD_t$ in a radial direction of a lower surface of the template can be digitized. Measurement data is output to, e.g., a monitor of the PC. Here, FIG. 6 shows an example of the measurement data. "Displacement from reference surface" on an axis of ordinate in a graph of FIG. 6 represents a displacements (mm) of each, measurement point from a specific reference surface, and "angle" represents an angle (°) of each of the annular member and the backing pad from each reference position in a circumferential direction. An average value of $PD_t$ in the radial direction in the concave portion may be calculated from the thus digitized distribution of $PD_t$.

Subsequently, the calculating means 13 performs calculation to calculate the difference $\Delta PD$ between the measured depth $PD_t$ of the concave portion 9 and the depth $PD_0$ of the concave portion 9 of the template 8 before being used for polishing. The measurement value of $PD_t$ is compared with $PD_0$ every time the measurement is performed in this manner.

Then, the adjusting means 14 or the like is used to perform the adjustment to adjust the polishing conditions for the next wafer to be polished in accordance with the calculated difference $\Delta PD$. In the method for polishing a wafer according to the present invention, in the adjustment, when one or both of a relative speed of the number of revolutions of the turntable 3 and the number of revolutions of the polishing head 2 and a polishing pressure are adjusted, an abrasion loss of the annular member 6 during the polishing can be adjusted in such a manner that the difference $\Delta PD$ decreases. Further, in the adjustment, when the backing pad 7 is changed to another backing pad whose plastic deformation amount differs depending on the polishing pressure, the plastic deformation amount of the backing pad can be adjusted in such a manner that the difference $\Delta PD$ decreases.

Furthermore, in the present invention, the adjustment can be carried out when the difference $\Delta PD$ between the depth $PD_t$ and the depth $PD_0$ has increased to be larger than a predetermined value. More specifically, for example, as an index of a change in magnitude of the difference $\Delta PD$, a provision can be set to a rate of change of the depth $PD_t$ from $PD_0$ to determine whether the adjustment is to be performed. It is to be noted that the rate of change can be defined as, e.g., (rate of change)=$[(PD_t-PD_0)/PD_0] \times 100$. Moreover, upper and lower-limit values of the rate of change can be set down in correspondence with a flatness standard. That is, the upper and lower limit values of the rate of change can be set so that flatness in a desired range can be provided.

Here, for example, a description will be given as to a case where ±3% is determined as each of the upper and lower limit values and the relative speed or the polishing pressure is adjusted as the polishing conditions. In this case, when (rate of change)>+3% is achieved, it can be determined that an outer peripheral portion of a wafer further rises, and also estimated that the flatness of the wafer becomes below the standard. Thus, the polishing conditions for the next wafer are adjusted so that the relative speed of the polishing head and the turntable is raised or the polishing pressure is raised to increase the abrasion loss A of the annular ring. To raise the relative speed, for example, the number of revolutions of the polishing head is increased or the number of revolutions of the turntable is decreased when the number of revolutions of the turntable is smaller than the number of revolutions of the polishing head.

On the other hand, when (rate of change)<−3% is achieved, it can be determined that the outer peripheral portion of the wafer further sags, and also estimated that the flatness of the wafer becomes below the standard. Thus, the polishing conditions for the next wafer are adjusted so that the relative speed of the polishing head and the turntable is decreased or the polishing pressure is decreased to reduce the abrasion loss A of the annular ring. To decrease the relative speed, for example, the number of revolutions of the polishing head is decreased or the number of revolutions of the turntable is increased when the number of revolutions of the turntable is smaller than the number of revolutions of the polishing head. When the rate of change falls within the range of the upper and lower limit values, the operation can be continued under the same polishing conditions. After the polishing conditions are adjusted in this manner, the next wafer is loaded and polished.

Additionally, the measurement and the calculation may be performed each time after the unloading or they may be performed in, e.g., each fixed cycle while repeating the loading to the unloading more than once. A frequency of the measurement and the calculation can be appropriately determined while considering an accuracy of required flatness, productivity, and the like.

As described above, according to the method for polishing a wafer of the present invention, a fluctuation in flatness of each wafer can be adjusted, or especially suppressed by appropriately adjusting the polishing conditions in correspondence with the difference $\Delta PD$ between the depths $PD_t$ and $PD_0$.

EXAMPLES

The present invention will now be more specifically described hereinafter with reference to examples and a comparative example of the present invention, but the present invention is not restricted thereto.

Example 1

A template with $PD_0 \approx 700$ μm was disposed to such a polishing head of a polishing apparatus according to the present invention as shown in FIG. 1, and silicon wafers were continuously polished in accordance with the flow shown in FIG. 4.

Further, a life of the template was determined as 450 hours, and flatness of each wafer and $PD_t$ were measured every 50 hours. $PD_t$ was measured by LJ-V7020 (manufactured by KEYENCE Corporation). Furthermore, in Example 1, ±3% of a rate of change of $PD_t$ from $PD_0$ was determined as each of upper and lower limit values, and polishing conditions were adjusted when the rate of change had become out of this range.

Specifically, when the rate of change had become out of this range, in Example 1, a relative speed of a turntable and the polishing head was adjusted by increasing or decreasing the number of revolutions of the head, thereby controlling an abrasion loss A of an annular member. The number of revolutions of the polishing head in the initial stage was set to 20 rpm. The number of revolutions of the turntable was fixed at a value smaller than the number of revolutions of the polishing head.

Figure 7:
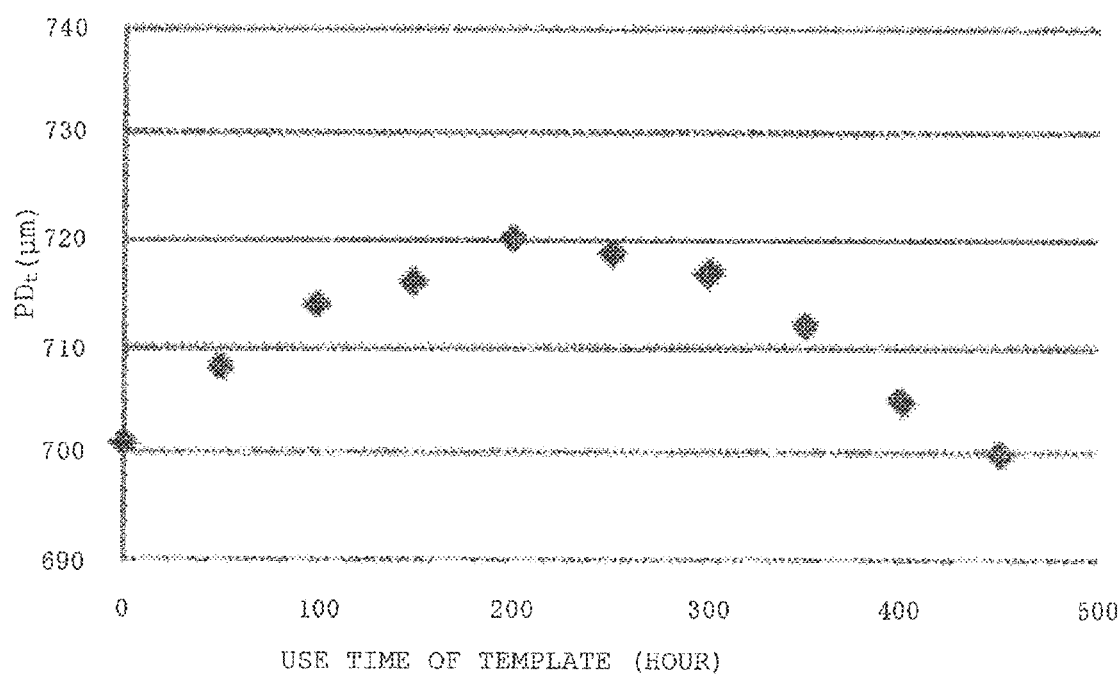
FIG. 7 shows a measurement result of $PD_t$ in Example 1.
Figure 8:
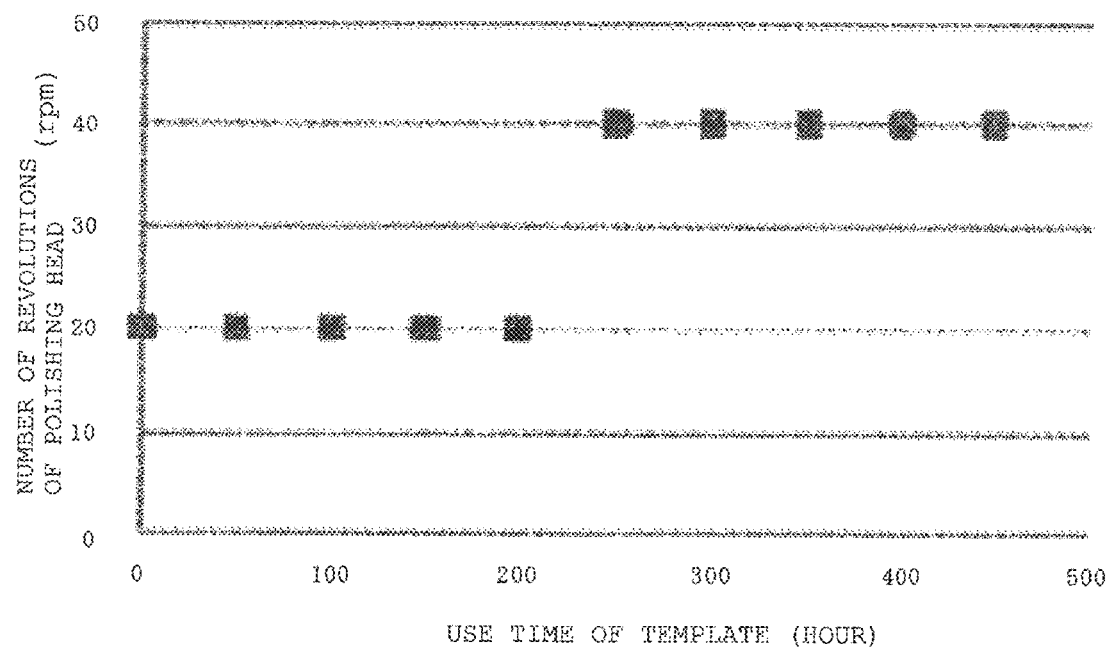
FIG. 8 is a graph showing changes in number of revolutions of a polishing head in Example 1.

As shown in FIG. 7, $PD_t$ was monotonously increased until a use time of the template reached 200 hours. Furthermore, when the use time of the template had reached 200 hours, the rate of change exceeded +3% as the upper limit value. Thus, as shown in FIG. 8, the number of revolutions of the polishing head was changed from 20 rpm to 40 rpm to increase the abrasion loss A of the annular member. Consequently, as shown in FIG. 7, after 200 hours, $PD_t$ changed to decrease, and the difference $\Delta PD$ became small.

The flatness of each polished wafer was measured by Wafersight manufactured by KLA-Tencor Corporation, it was confirmed by using a maximum value ESFQDmax of ESFQD (Edge Site Front least sQuares <site> Deviation). It is to be noted that ESFQDmax is an index which represents a rise shape of an outer periphery when it is a positive value or a sag shape of the same when it is a negative value.

Figure 9:
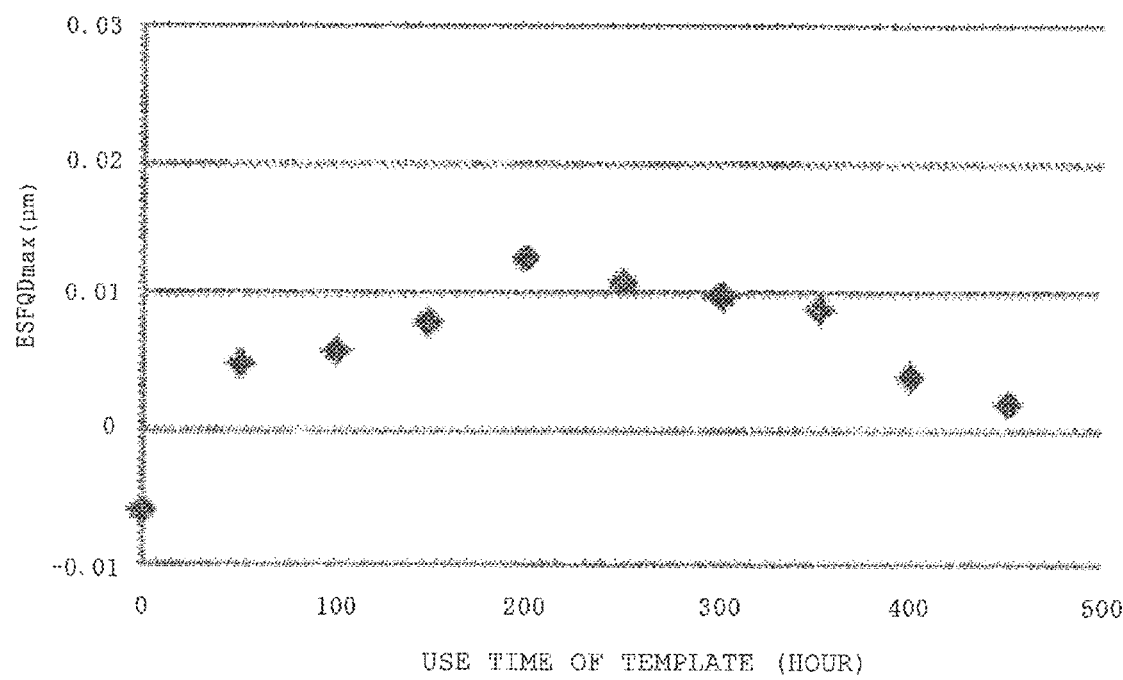
FIG. 9 shows a measurement result of ESFQDmax in Example 1.

FIG. 9 shows a result of measuring ESFQDmax of each wafer every 50 hours. ESFQDmax was monotonously increased until the use time of the template reached 200 hours like $PD_t$, but the polishing conditions were adjusted in accordance with the difference PD, and then this value was thus reduced.

Comparative Example

Basically, polishing was performed in the same manner as Example 1, but a depth of a concave portion was measured before disposing a template to a polishing head and after removing the template in Comparative Example. That is, like conventional examples, polishing conditions were not adjusted in accordance with am aging variation of the depth of the concave portion, and the number of revolutions of the polishing head was set to 20 rpm from beginning to end. The number of revolutions of a turntable was fixed like Example.

Figure 10:
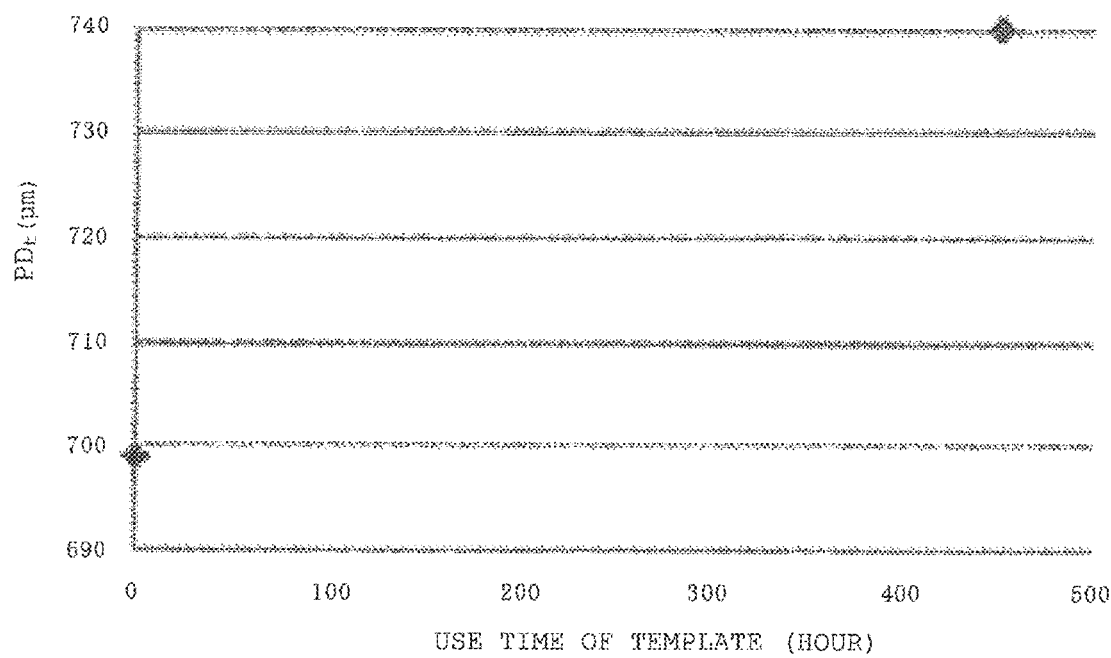
FIG. 10 is a measurement result of $PD_t$ in Comparative Example.
Figure 11:
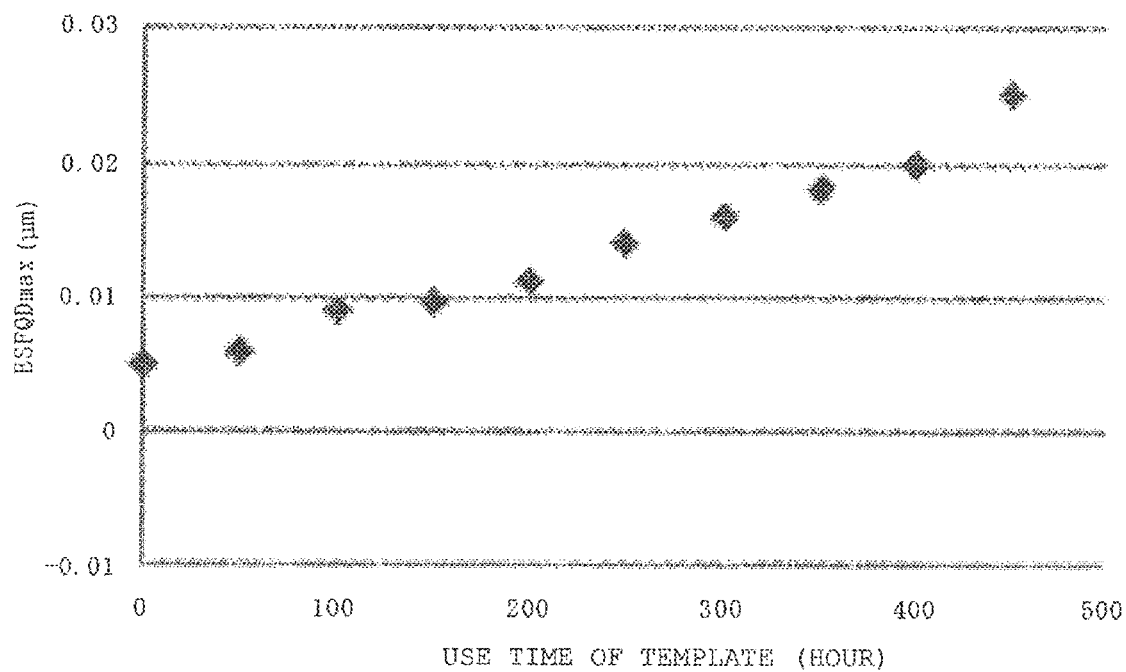
FIG. 11 is a measurement result of ESFQDmax in Comparative Example.

Consequently, as shown in FIG. 10, the depth $PD_t$ of the concave portion after end of polishing (after 450 hours) rose to 740 μm. Furthermore, as shown in FIG. 11, ESFQDmax kept monotonously increasing, and a rise shape greatly advanced as compared with Example 1.

Example 2

After end of Example 1, polishing conditions were adjusted in adjustment based on data of $\Delta PD$ obtained in Example 1 in such a manner that $\Delta PD$ can further decrease by continuously polishing of subsequent silicon wafers and flatness of polished silicon wafers can be further improved. Specifically, wafers were polished under the same conditions as those of Example 1 except that a template was replaced with a template having a smaller plastic deformation amount of a backing pad and the number of revolutions of a polishing head was set to 20 rpm. The plastic deformation amount of the backing pad was adjusted by changing a material of the backing pad to reduce a compression ratio by 50%, Moreover, in Example 2, ±1% of a rate of change of $PD_t$ from $PD_0$ was set as each of upper and lower limit values.

Figure 12:
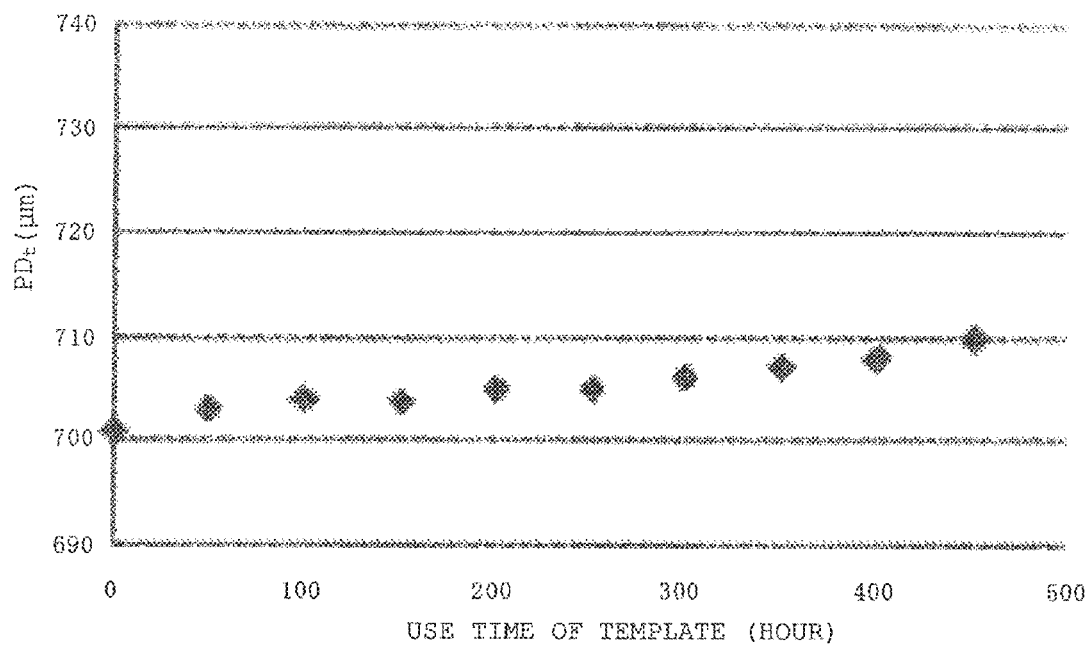
FIG. 12 is a measurement result of $PD_t$ in Example 2.
Figure 13:
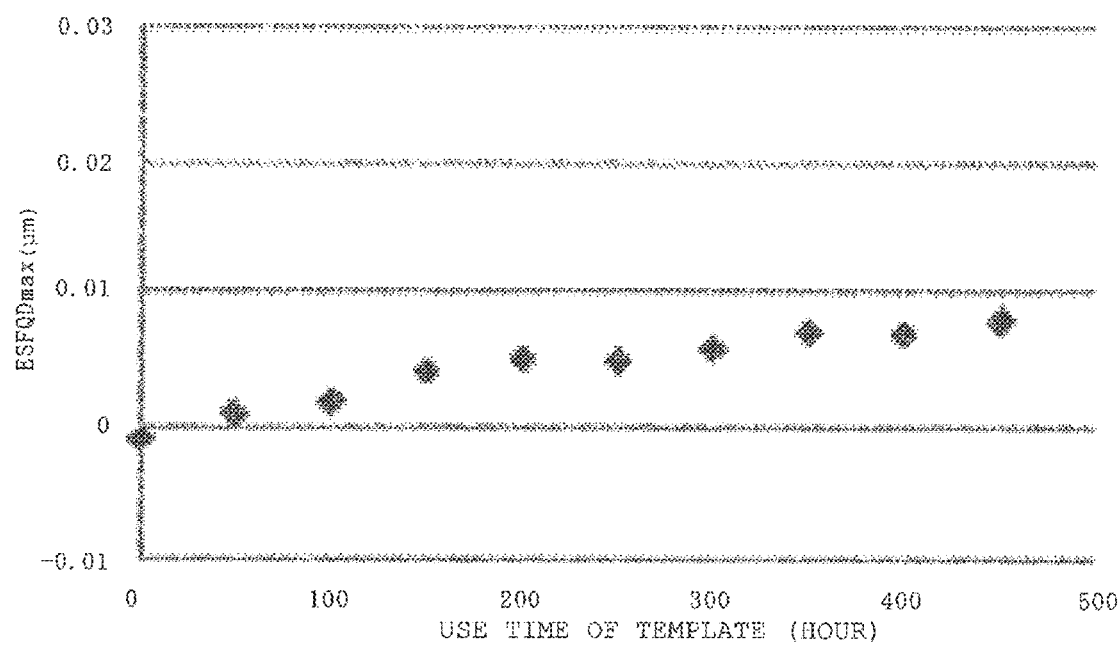
FIG. 13 is a measurement result of ESFQDmax in Example 2.

Consequently, as shown in FIG. 12, the rate of change of $PD_t$ was ±1% or less from beginning to end, and a fluctuation in $PD_t$ was a half or less of that in Comparative Example. Additionally, as shown in FIG. 13, an increased amount of ESFQDmax was also a half or less of that in Comparative Example. Further, averages of fluctuations in $PD_t$ and $\Delta PD$ were reduced as compared with Example 1, and an average of ESFQDmax was also reduced. Consequently, it was confirmed that a variation in flatness can be further suppressed by repeatedly performing the polishing and adjusting the plastic deformation amount of the backing pad in correspondence with data of $\Delta PD$ by the polishing method according to the present invention.

Example 3

After end of Example 2, based on the data of $\Delta PD$ obtained in Examples 1 and 2, polishing conditions were again adjusted in the adjustment in such a manner that ΔPD could be further decreased and flatness could be improved by continuously polishing subsequent silicon wafers. Specifically, the same backing pad as that in Example 2 was used, the number of revolutions of a polishing head was optimized, and the initial number of revolutions of the polishing head was adjusted to 25 rpm. As for the rest, the wafers were polished under the same, conditions as those in Example 2.

Figure 14:
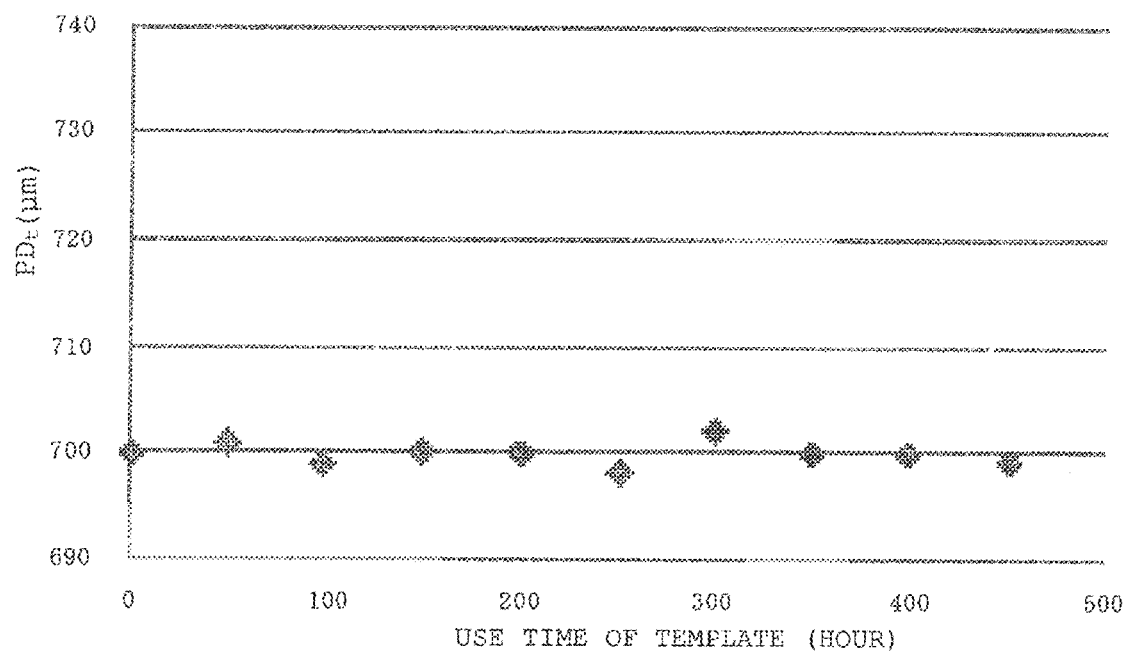
FIG. 14 is a measurement result of $PD_t$ in Example 3.
Figure 15:
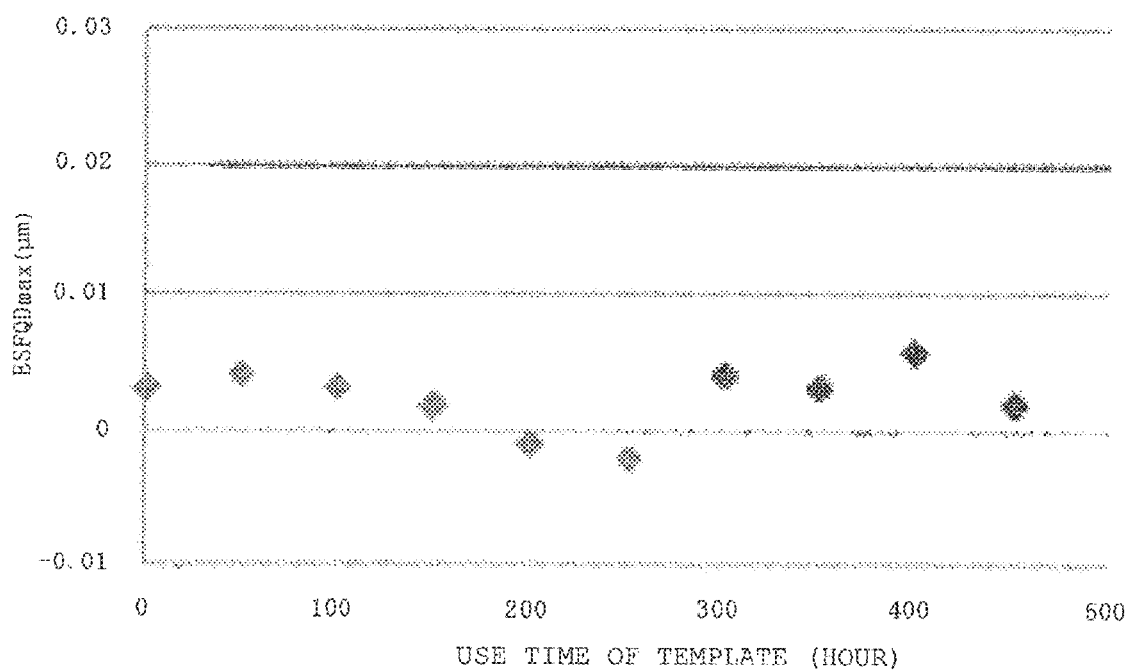
FIG. 15 is a measurement result of ESFQDmax in Example 3.

Consequently, as show in FIG. 14, a rate of change of $PD_t$ was ±1% or less from beginning to end, and a difference from $PD_0$ was hardly produced. Furthermore, as shown in FIG. 15, an amount of change in ESFQDmax was the smallest among Examples, Consequently, it was confirmed that the polishing method according to the present invention enables further suppressing a variation in flatness by repeatedly performing polishing and adjusting both a relative speed of the numbers of revolutions of a turntable and the polishing pad and a plastic deformation amount of the backing pad in correspondence with, the data of ΔPD.

Table 1 shows conditions and implementation results in Examples 1 to 3 and Comparative Example as a whole. It is to be noted that average values and standard deviations of $PD_t$ and ESFQDmax are average values and standard deviations of aggregate data from an initial stage to a terminal, stage of a life of a template.

TABLE 1

| | Number of revolutions of polishing head [rpm] | Backing pad compression ratio [ratio] | A [μm] | P [μm] | $PD_0$ [μm] Average | $PD_t$ [μm] Average | $PD_t$ [μm] Standard deviation | ESFQDmax [μm] Average | ESFQDmax [μm] Standard deviation |
|---|---|---|---|---|---|---|---|---|---|
| Comparative Example | 20 | 1 | 17 | 50 | 699 | 719.5 | 28.99138 | 0.01335 | 0.006429 |
| Example 1 | 20-40 | 1 | 45 | 48 | 701 | 711.2 | 7.315129 | 0.0062 | 0.005453 |
| Example 2 | 20 | 0.5 | 17 | 25 | 701 | 704.3 | 1.418136 | 0.0044 | 0.002914 |
| Example 3 | 25 | 0.5 | 26 | 25 | 700 | 699.9 | 1.100505 | 0.0024 | 0.002366 |

As can be understood from Table 1, in each of Examples 1 to 3, a difference between A and P was reduced, and the difference ΔPD of $PD_t$ from $PD_0$ was controlled to be small, and hence the average and the standard, deviation of ESFQDmax were also suppressed to small values as compared, with Comparative Example. That is, a fluctuation in flatness of each wafer was able to be suppressed by adjusting the polishing conditions in accordance with ΔPD in each of Examples 1 to 3.

It is to be rioted that the present invention is not restricted to the embodiment. The embodiment is an illustrative example, and any example which has substantially the same structure and exerts the same functions and effects as the technical scope described in claims of the present invention is included in the technical scope of the present invention.

The invention claimed is:

1. A method for polishing a wafer by which a plurality of wafers are polished, with the use of a rotatable polishing head having a template which has an annular member and a backing pad attached to each other and has a concave portion to house and hold a wafer formed therein by using an inner peripheral surface of the annular member and a surface of the backing pad attached to the annular member, by repeating loading to house and hold the wafer in the concave portion, polishing to press the wafer held by the polishing head against a polishing pad attached to an upper side of a rotatable turntable for polishing while rotating the turntable and the polishing head, and unloading to take out the polished wafer from the concave portion of the template,
   wherein the method comprises, after the unloading and before the loading to hold a next wafer to be polished:
   measurement to measure a depth $PD_t$ of the concave portion after taking out the polished wafer;
   calculation to calculate a difference ΔPD between the measured depth $PD_t$ of the concave portion and a depth $PD_0$ of the concave portion of the template before being used for polishing; and
   adjustment to adjust polishing conditions for a next wafer to be polished in accordance with the calculated difference ΔPD.

2. The method for polishing a wafer according to claim 1, wherein, in the adjustment, an abrasion loss of the annular member during polishing is adjusted in such a manner that the difference ΔPD decreases by adjusting one or both of a relative speed of the number of revolutions of the turntable and the number of revolutions of the polishing head and a polishing pressure.

3. The method for polishing a wafer according to claim 2, wherein, in the adjustment, a plastic deformation amount of the backing pad is adjusted in such a manner that ΔPD decreases by changing the backing pad to another backing pad having a different amount of plastic deformation caused by the polishing pressure.

4. The method for polishing a wafer according to claim 3, wherein the adjustment is performed when the difference ΔPD between the depth $PD_t$ and the depth $PD_0$ has exceeded a predetermined value.

5. The method for polishing a wafer according to claim 2, wherein the adjustment is performed when the difference ΔPD between the depth $PD_t$ and the depth $PD_0$ has exceeded a predetermined value.

6. The method for polishing a wafer according to claim 1, wherein, in the adjustment, a plastic deformation amount of the backing pad is adjusted in such a manner that ΔPD decreases by changing the backing pad to another backing pad having a different amount of plastic deformation caused by the polishing pressure.

7. The method for polishing a wafer according to claim 6, wherein the adjustment is performed when the difference ΔPD between the depth $PD_t$ and the depth $PD_0$ has exceeded a predetermined value.

8. The method for polishing a wafer according to claim 1, wherein the adjustment is performed when the difference ΔPD between the depth $PD_t$ and the depth $PD_0$ has exceeded a predetermined value.

9. A polishing apparatus comprising: a rotatable polishing head having a template which has an annular member and a backing pad attached to each other and has a concave portion to house and hold a wafer formed therein by using an inner peripheral surface of the annular member and a surface of the backing pad attached to the annular member; and a polishing pad attached to an upper side of a rotatable turntable, the apparatus pressing the wafer held by the polishing head against the polishing pad for polishing while rotating the turntable and the polishing head, wherein the polishing apparatus comprises:

measuring means configured to measure a depth $PD_t$ of the concave portion of the template after taking out the polished wafer;

calculating means for calculating a difference $\Delta PD$ between the measured depth $PD_t$ of the concave portion and a depth $PD_0$ of the concave portion of the template before being used for polishing; and adjusting means for adjusting polishing conditions for a next wafer to be polished in accordance with the calculated difference $\Delta PD$.

10. The polishing apparatus according to claim 9, wherein the adjusting means adjusts an abrasion loss of the annular member during polishing in such a manner that the difference $\Delta PD$ decreases by adjusting one or both of a relative speed of the number of revolutions of the turntable and the number of revolutions of the polishing head and a polishing pressure.

11. The polishing apparatus according to claim 10, wherein the adjusting means adjusts the polishing conditions when the difference $\Delta PD$ between the depth $PD_t$ and the depth $PD_0$ has exceeded a predetermined value.

12. The polishing apparatus according to claim 11, wherein the measuring means comprises: a sensor unit which measures the depth $PD_t$ of the concave portion of the template from which the polished wafer has been removed; and a movement unit which moves the sensor unit to be placed below the template at the time of measuring the depth $PD_t$ of the concave portion.

13. The polishing apparatus according to claim 10, wherein the measuring means comprises: a sensor unit which measures the depth $PD_t$ of the concave portion of the template from which the polished wafer has been removed; and a movement unit which moves the sensor unit to be placed below the template at the time of measuring the depth $PD_t$ of the concave portion.

14. The polishing apparatus according to claim 9, wherein the adjusting means adjusts the polishing conditions when the difference $\Delta PD$ between the depth $PD_t$ and the depth $PD_0$ has exceeded a predetermined value.

15. The polishing apparatus according to claim 14, wherein the measuring means comprises: a sensor unit which measures the depth $PD_t$ of the concave portion of the template from which the polished wafer has been removed; and a movement unit which moves the sensor unit to be placed below the template at the time of measuring the depth $PD_t$ of the concave portion.

16. The polishing apparatus according to claim 9, wherein the measuring means comprises: a sensor unit which measures the depth $PD_t$ of the concave portion of the template from which the polished wafer has been removed; and a movement unit which moves the sensor unit to be placed below the template at the time of measuring the depth $PD_t$ of the concave portion.

* * * * *